(12) United States Patent
Hyun et al.

(10) Patent No.: US 10,860,751 B2
(45) Date of Patent: Dec. 8, 2020

(54) CUTTING PROCESS SIMULATION METHOD AND SYSTEM THEREOF

(71) Applicant: KOREA ATOMIC ENERGY RESEARCH INSTITUTE, Daejeon (KR)

(72) Inventors: Dong Jun Hyun, Daejeon (KR); Byung Seon Choi, Daejeon (KR); Kwan Seong Jeong, Sejong (KR); Jong Hwan Lee, Daejeon (KR); Ik June Kim, Daejeon (KR); Geun Ho Kim, Daejeon (KR); Jei Kwon Moon, Daejeon (KR)

(73) Assignee: KOREA ATOMIC ENERGY RESEARCH INSTITUTE, Daejeon (KR)

( * ) Notice: Subject to any disclaimer, the term of this patent is extended or adjusted under 35 U.S.C. 154(b) by 616 days.

(21) Appl. No.: 15/303,929

(22) PCT Filed: Oct. 21, 2014

(86) PCT No.: PCT/KR2014/009907
§ 371 (c)(1),
(2) Date: Feb. 16, 2017

(87) PCT Pub. No.: WO2015/160054
PCT Pub. Date: Oct. 22, 2015

(65) Prior Publication Data
US 2017/0169158 A1    Jun. 15, 2017

(30) Foreign Application Priority Data

Apr. 14, 2014   (KR) ......................... 10-2014-0044380

(51) Int. Cl.
*G06F 30/17*    (2020.01)
*G05B 19/4097*    (2006.01)
(Continued)

(52) U.S. Cl.
CPC ......... *G06F 30/17* (2020.01); *G05B 19/4069* (2013.01); *G05B 19/4097* (2013.01);
(Continued)

(58) Field of Classification Search
CPC . G06F 17/5086; G06F 17/50; G05B 19/4069; G05B 19/4097
(Continued)

(56) References Cited

U.S. PATENT DOCUMENTS

| 4,163,321 | A | * | 8/1979 | Cunningham | ....... G06Q 10/043 33/1 S |
| 4,510,368 | A | * | 4/1985 | Schlienger | ........... B23K 9/0135 219/68 |

(Continued)

FOREIGN PATENT DOCUMENTS

| JP | 2003-276006 | 9/2003 |
| JP | 2012-043424 | 3/2012 |

(Continued)

OTHER PUBLICATIONS

Park et al.("The Application of Visualization and Simulation in a Dismantling Process", Journal of Nuclear Science and Technology, vol. 44, No. 4, p. 649-656 (2007) (Year: 2007).*

(Continued)

*Primary Examiner* — Iftekhar A Khan
(74) *Attorney, Agent, or Firm* — Scully Scott Murphy and Presser

(57) ABSTRACT

The present invention relates to a cutting process simulation method and a system thereof which can efficiently optimize the decommissioning process of a nuclear facility, thereby saving costs and time and ensuring safety in the decommissioning process. The cutting process simulation system, according to one embodiment of the present invention, may comprise: a display unit: and a control unit which cuts a (Continued)

cutting target in a nuclear facility by using a design program, displays the cut shape on the display unit, and predicts the amount of secondary waste generated in the process of cutting the cutting target.

6 Claims, 3 Drawing Sheets

(51) Int. Cl.
  *G05B 19/4069* (2006.01)
  *G06F 30/00* (2020.01)
(52) U.S. Cl.
  CPC .... *G06F 30/00* (2020.01); *G05B 2219/35009* (2013.01); *G05B 2219/35097* (2013.01); *G05B 2219/35123* (2013.01); *G05B 2219/45044* (2013.01)
(58) Field of Classification Search
  USPC .......................................................... 703/7
  See application file for complete search history.

(56) References Cited

U.S. PATENT DOCUMENTS

| | | | | | |
|---|---|---|---|---|---|
| 4,594,774 | A | * | 6/1986 | Barker | G21D 1/003 29/426.1 |
| 4,813,313 | A | * | 3/1989 | Ichikawa | B23D 45/024 299/70 |
| 4,818,472 | A | * | 4/1989 | Operschall | G21F 9/28 376/260 |
| 5,158,739 | A | * | 10/1992 | Gente | G21F 9/005 376/260 |
| 5,202,062 | A | * | 4/1993 | Baba | G21F 9/008 210/754 |
| 5,297,182 | A | * | 3/1994 | Cepkauskas | G21D 1/003 376/260 |
| 5,315,525 | A | * | 5/1994 | Bluthgen | G05B 19/4069 700/182 |
| 5,479,969 | A | * | 1/1996 | Hardie | B65B 3/003 141/103 |
| 5,483,562 | A | * | 1/1996 | Kornfeldt | G21F 9/28 376/287 |
| 5,523,513 | A | * | 6/1996 | Milner | C23F 1/44 134/13 |
| 5,701,400 | A | * | 12/1997 | Amado | G06N 5/02 706/45 |
| 5,936,863 | A | * | 8/1999 | Kostelnik | G06Q 10/08 376/260 |
| 6,087,546 | A | * | 7/2000 | Griffiths | G21D 1/003 250/506.1 |
| 6,203,112 | B1 | * | 3/2001 | Cook | E01C 23/0933 125/13.01 |
| 6,452,993 | B1 | * | 9/2002 | Aoki | G21D 1/003 376/260 |
| 7,751,917 | B2 | * | 7/2010 | Rees | G06F 30/00 700/97 |
| 8,340,812 | B1 | * | 12/2012 | Tian | G06Q 10/04 700/216 |
| 10,014,084 | B2 | * | 7/2018 | LaGuardia | B23K 9/0135 |
| 2001/0039487 | A1 | * | 11/2001 | Hammersley | G06T 17/005 703/2 |
| 2002/0124707 | A1 | * | 9/2002 | Izard | B23D 61/025 83/835 |
| 2005/0002571 | A1 | * | 1/2005 | Hiraga | G06K 9/469 382/218 |
| 2009/0309875 | A1 | * | 12/2009 | Okada | G06T 19/00 345/419 |
| 2010/0045777 | A1 | * | 2/2010 | Mellor | G01T 1/167 348/42 |
| 2011/0288903 | A1 | * | 11/2011 | Mahe-Doutreluingne | G21D 1/003 705/7.23 |
| 2013/0338987 | A1 | * | 12/2013 | Cheng | G06F 30/20 703/10 |

FOREIGN PATENT DOCUMENTS

| | | |
|---|---|---|
| KR | 10-2005-0007856 | 1/2005 |
| KR | 10-2006-0085651 | 7/2006 |

OTHER PUBLICATIONS

Iguchi et al. hereafter Iguchi ("Developmentof Decommissioning Engineering Support System (Dexus of the Fugen Nuclear PowerStation", Journal of Nuclear Science and Technology, vol. 41, No. 3, p. 367-375 (Mar. 2004)) (Year: 2004).*
Yangaihara et al. ("Development of Computer Systems for Planning and Management of Reactor Decommissioning", Journal of Nuclear Science and Technology, vol. 38, No. 3, p. 193-202 (Mar. 2001)) (Year: 2001).*
Liu et al. ("Study on Simulation Method of the Smoke-dust in Nuclear Decommissioning Virtual Simulation", Journal of Computers, vol. 6, No. 2, Feb. 2011, pp. 343-350) (Year: 2011).*
Tachibana et al. ("Development of remote dismantling systems for decommissioning of Nuclear facilities", WM'00 Conference, Feb. 27-Mar. 2, 2000, Tucson, AZ, pp. 1-9) (Year: 2000).*
Mandorli et al. ("Reference Kernel Model for Feature-Based CAD Systems Supported by Conditional Attributed Rewrite Systems",IEEE, 1993, pp. 1-13) (Year: 1993).*
Kim et al. ("A framework for a flexible cutting-process simulation of a nuclear facility decommission", Elsevier Ltd, 2016, pp. 204-207) (Year: 2016).*
Yun et al. ("Development of a virtual machining system, part 3: cutting process simulation in transient cuts", International Journal of Machine Tools & Manufacture 42 (2002) 1617-1626) (Year: 2002).*
Per-0le Nielsen ("Waste from Decommissioning of Nuclear Power Plants", SKI Technical Report 92:17, 1992, pp. 1-70) (Year: 1992).*
Szoke et al ("Comprehensive support for nuclear decommissioning based on 3D simulation and advanced user interface technologies", Journal of Nuclear Science and Technology, 2015, pp. 371-387) (Year: 2015).*
International Preliminary Report on Patentability for PCT/KR2014/009907, dated Oct. 18, 2016, 11 pages.
International Search Report and Written Opinion for PCT/KR2014/009907, dated Oct. 22, 2015, 14 pages.
Grandjean et al., "CITADIN: computer integrated teleoperation and dismantling in nuclear installations," Proceedings of the ANS Seventh Topical Meeting on Robotics and Remote Systems, Radisson Riverfront Hotel and Conference Center, Augusta, Georgia, USA, American Nuclear Society, Apr. 27 to May 1, 1997, vol. 2, pp. 748-753.
Iguchi et al., "Development of Decommissioning Engineering Support System (DEXUS) of the Fugen Nuclear Power Station," Journal of Nuclear Science and Technology (2004) 41(3):367-375.
Supplementary European Search Report for EP 14889419.9, dated Dec. 19, 2017, 10 pages.

* cited by examiner

CUTTING PROCESS SIMULATION METHOD AND SYSTEM THEREOF

CROSS-REFERENCE TO RELATED APPLICATIONS

This application is the national phase of PCT application PCT/KR2014/009907 having an international filing date of Oct. 21, 2014, which claims the benefit of earlier filing date and right of priority to Korean Application No. 10-2014-0044380, filed on Apr. 14, 2014, the contents of which are incorporated by reference herein in their entirety.

TECHNICAL FIELD

The present invention relates to a cutting process simulation method and system which use a design program.

BACKGROUND ART

In general, nuclear facility decommissioning is a process that is cost- and time-consuming and dangerous, so it is necessary to reduce costs and time through optimization and improve safety by evaluating the risk of the process in advance. Nuclear facility decommissioning always involves cutting large-scale structures. However, the existing process simulation programs have no function of simulating the cutting process. This makes it difficult to use them for optimization of the decommissioning process.

DISCLOSURE OF THE INVENTION

Therefore, an object of the present invention is to provide a cutting process simulation system and method which can save the cost and time required for decommissioning and ensure safety by efficiently optimizing nuclear facility decommissioning.

To achieve these and other advantages and in accordance with the purpose of the present invention, as embodied and broadly described herein, there is provided a cutting process simulation system, including: a display; and a controller that cuts a product corresponding to a facility in a nuclear plant by using a design program, that represents a cut geometry on the display, and that estimates the amount of secondary waste generated from the process of cutting the product.

According to the exemplary embodiment of the present invention, the design program may be a CAD (computer-aided design) program.

According to the exemplary embodiment of the present invention, the product may be cut by using the CAD program and API (application programming interface) functions.

According to the exemplary embodiment of the present invention, the controller may create a cut geometry for cutting the product into a solid model by using cutting tools and a cutting trajectory, and represent a cut geometry with a thickness and depth on the display by performing a remove operation on the product according to the model of the cut geometry.

According to the exemplary embodiment of the present invention, the controller may represent cases where the product is cut but cannot be cut, where the product is cut into two parts, and where the product is cut into three or more parts.

According to the exemplary embodiment of the present invention, if there is an overlap between the product and the cut geometry, the controller may determine that cutting has been done, and if there is no overlap between the product and the cut geometry, the controller may determine that no cutting has been done.

According to the exemplary embodiment of the present invention, the controller may calculate the volume of the geometry of an intersection between the product and the cut geometry by performing an intersect operation on the product and the cut geometry, and estimate the amount of secondary waste generation by multiplying the calculated volume and the density of the product.

According to the exemplary embodiment of the present invention, the controller may cut the product repeatedly.

A cutting process simulation method according to an exemplary embodiment of this document may include: cutting a product corresponding to a facility in a nuclear plant by using a design program; representing the cut geometry on a display; and estimating the amount of secondary waste generated from the process of cutting the product.

MODES FOR CARRYING OUT THE PREFERRED EMBODIMENTS

Figure 1:
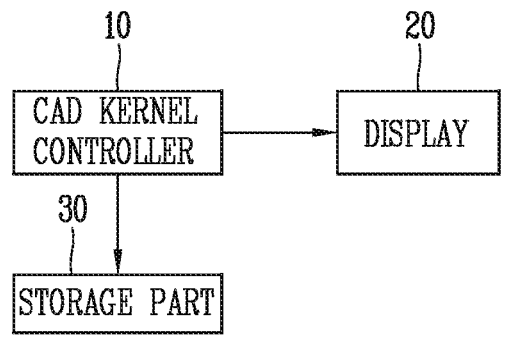
FIG. 1 is a view showing a cutting process simulation system using a CAD kernel according to an exemplary embodiment of the present invention.

It is to be noted that technical terms used in this specification are used to describe only specific embodiments and are not intended to limit the present invention. Furthermore, the technical terms used in this specification should be construed as having meanings that are commonly understood by those skilled in the art to which the present invention pertains unless especially defined as different meanings otherwise in this specification, and should not be construed as having excessively comprehensive meanings or excessively reduced meanings. Furthermore, if the technical terms used in this specification are wrong technical terms that do not precisely represent the spirit of the present invention, they should be replaced with technical terms that may be correctly understood by those skilled in the art and understood. Furthermore, common terms used in the present invention should be interpreted in accordance with the definition of dictionaries or in accordance with the context, and should not be construed as having excessively reduced meanings.

Furthermore, an expression of the singular number used in this specification includes an expression of the plural number unless clearly defined otherwise in the context. In this application, terms, such as "comprise" and "include", should not be construed as essentially including all several components or several steps described in the specification, but the terms may be construed as not including some of the components or steps or as including additional component or steps.

Furthermore, terms including ordinal numbers, such as the first and the second which are used in this specification, may be used to describe a variety of components, but the components should not be limited to the terms. The terms are used to only distinguish one component from the other component. For example, a first component may be named a second component and likewise a second component may be named a first component without departing from the scope of the present invention.

Hereinafter, exemplary embodiments of the present invention will be described in detail with reference to the accompanying drawings. The same or similar components are assigned the same reference numerals regardless of their reference numerals, and a redundant description thereof is omitted.

In describing the present invention, when it is deemed that a detailed description of known functions or configurations may unnecessarily obscure the subject matter of the present invention, the detailed description will be omitted.

Also, it should be noted that the drawings are provided only for better understanding of the present invention, and therefore should not be construed as limiting the spirit and scope of this invention.

Hereinafter, a cutting process simulation method and system using a design program (e.g., computer-aided design (CAD) kernel) will be described with reference to FIGS. 1 and 2, which can represent a cut geometry created in a cutting process, estimate the amount of secondary waste generated from the cutting process, and reduce the data capacity of cut objects even if the cut objects are cut over and over again repeatedly in the cutting process.

Since a cutting process simulation method and system according to an exemplary embodiment of the present invention run on a CAD kernel, they may be implemented through data types in the CAD kernel and API (application programming interface) functions.

The data types in the CAD kernel may be defined as follows:
product: A file format that defines information on a product consisting of one or more "parts"
part: A file format that consists of one or more bodies and defines information on one part. It includes one body as default when first created, and the name of this "body" is defined as "partbody".
body: A set that defines information on one or more geometries. It belongs to a part
topVolume: A set that represents one or more volumes by topology
topSolid: A set that represents one or more faces by topology
specObj: Data that represents geometry information by specification
specSet: A specObj set
fVol, fWeight$_{2nd\ waste}$: Real number
nVol, nFAc, nPart, 1,j: Integer value
bResult: Boolean value
In the CAD kernel, "topology"-type data is the data type used to perform geometrical operations such as "Remove", "Intersect", "CreateCloseSurface", etc., and needs to be converted into "specObj"-type data. A body is compatible with "specObj".

The API functions may be defined as follows:
CreateNewPart( ): Create a new file as a part
GetParentProduct(part): Get information on a product to which a part belongs
Append(set): A corresponding file is appended to a set
GetBody(part, bodyname): Get information on a body by retrieving the bodyname from a part.
Copy(body, part): Copy and paste a body to a part
Intersect(Body$_1$, body$_2$): Perform an Intersect operation on body$_1$ and body$_2$
GetVolume(Body): Calculate the volume of a body as a real number
GetDEnsity(body): Get density information from a body's material information
Remove(Body$_1$, body$_2$): Perform an Remove operation to remove body$_2$ from body$_1$
GetResults(body): Get the final results of a body by topology
GetAllCells(topology, cell): Get topology information corresponding to cells(Volume=3, Face=2, Edge=1, Point=0) from topology
SizeOf(data): Calculate the number of data units
Featurize(topology): Convert topology to specObj
CreateAssemble(specSet): Convert specSet to one specObj
CreateCloseSurface(specOBj): Create a solid from face(s) defined by specObj
Delete(data): Delete data FIG. 1 is a view showing a cutting process simulation system using a CAD kernel according to an exemplary embodiment of the present invention.

Figure 2:
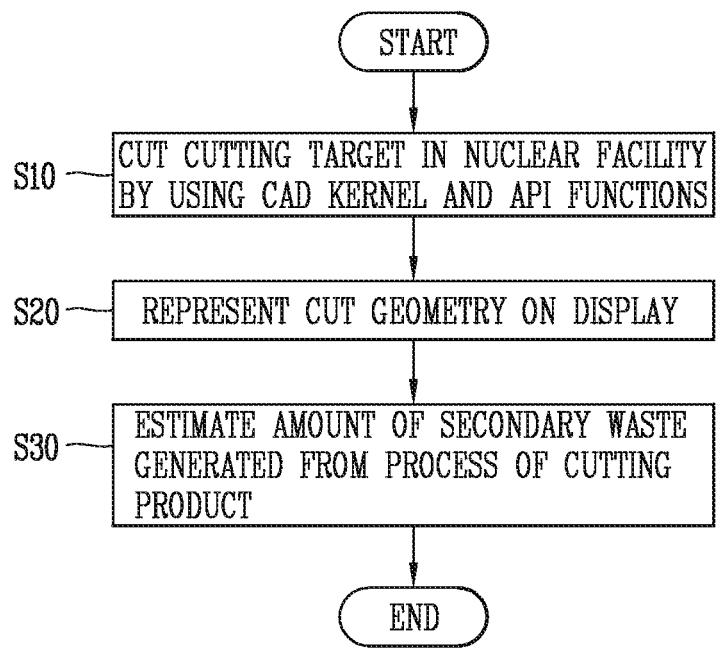
FIG. 2 is a flowchart showing a cutting process simulation system using a CAD kernel according to the exemplary embodiment of the present invention.

FIG. 2 is a flowchart showing a cutting process simulation system using a CAD kernel according to the exemplary embodiment of the present invention.

First of all, a CAD controller (CAD kernel controller) 10 cuts a product, which is to be dismantled from a nuclear facility (S10), by using a CAD kernel and API functions, and represents (displays) the cut geometry on a display 20 (S20). For example, the CAD controller 10 creates a cut geometry (part$_{Cutter}$) for cutting the product into a solid model by using cutting tools and a cutting trajectory, and represents a physical cut geometry with a thickness and depth by performing a remove operation on the product according to the model of the cut geometry (part$_{Cutter}$).

The cut geometry (part$_{Cutter}$) refers to a part having a cut geometry defined by the cutting tools and the cutting trajectory.

Figure 3A:
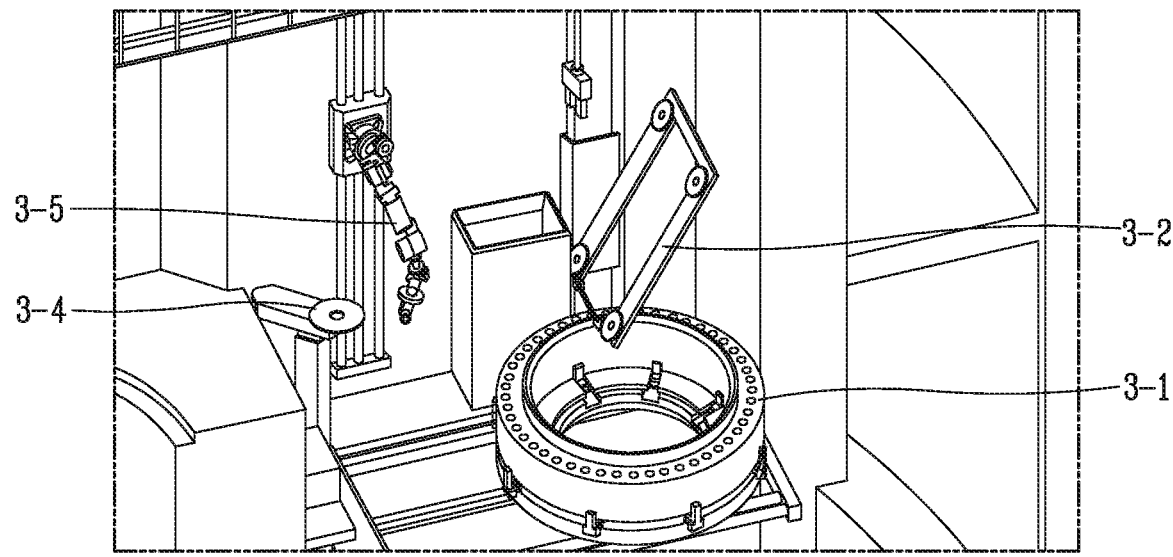
FIGS. 3A through 3C are illustrations of a simulation of a process for dismantling (cutting) a reactor pressure vessel head by using a CAD kernel according to the exemplary embodiment of the present invention.
Figure 3B:
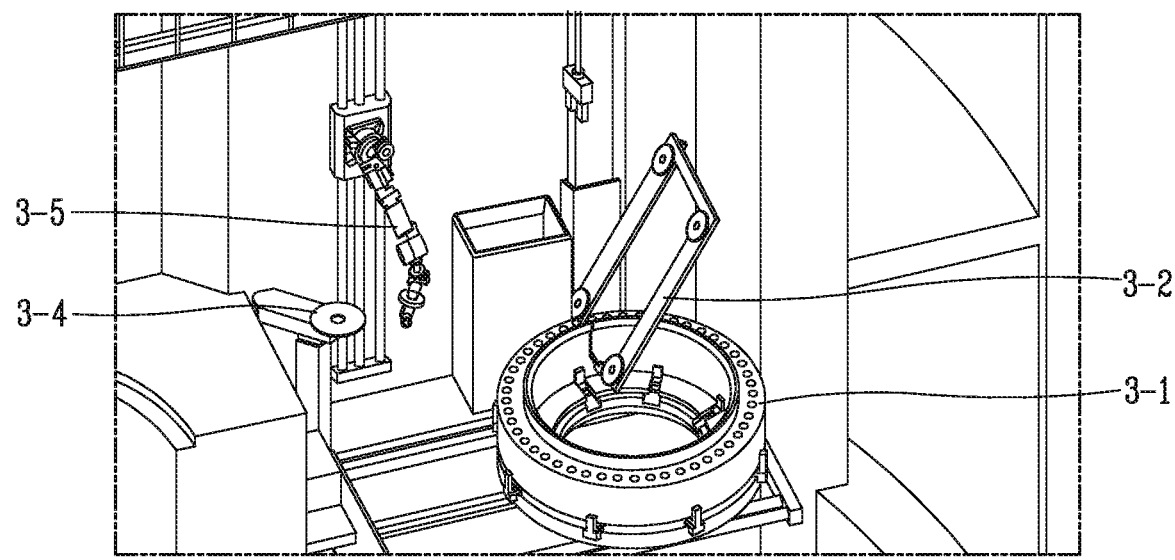
Figure 3C:
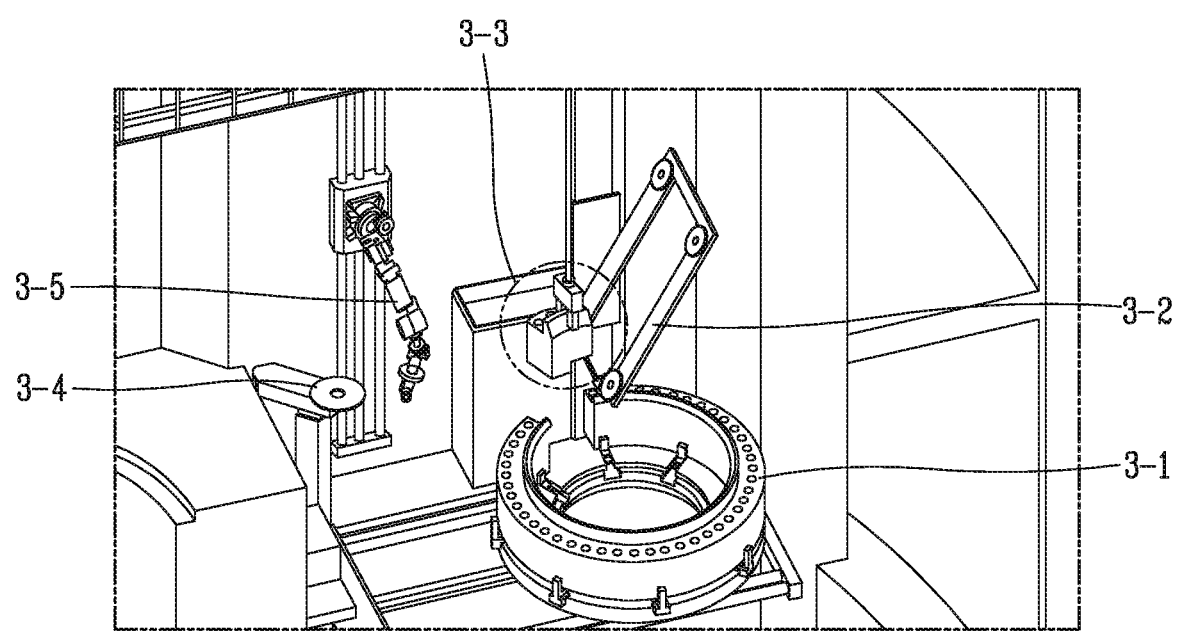

FIGS. 3A through 3C are illustrations of a simulation of a process for dismantling (cutting) a reactor pressure vessel head by using a CAD kernel according to the exemplary embodiment of the present invention.

As illustrated in FIGS. 3A and 3B, the CAD controller 10 cuts a product (e.g., a reactor pressure vessel head) 3-1, which is to be dismantled from a nuclear facility, by using cutting tools 3-2, 3-4, and 3-5 and a cutting trajectory.

As illustrated in FIG. 3C, the CAD controller 10 creates a cut geometry (part$_{Cutter}$) for cutting the product 3-1 into a solid model by using the cutting tools and the cutting trajectory, and represents the model of the cut geometry (part$_{Cutter}$) 3-3 on the display 20. The cut geometry (part$_{Cutter}$) may be defined variously by the product, the types of the cutting tools 3-2, 3-4, and 3-5, and the cutting trajectory. The CAD controller 10 may select various cutting tools and various cutting trajectories to cut the product 301 according to user input. Here, the reactor pressure vessel head may be cut into several tens or hundreds of pieces.

The CAD controller 10 may represent all possible cases in the cutting process, where the product cannot be machined, where the product is cut but cannot be cut, where the product is cut into two parts, and where the product is cut into three or more parts.

The CAD controller 10 may determine whether cutting has been done or not (bResult). For example, if there is an overlap between the product and the cut geometry (part$_{Cutter}$), cutting has been done and therefore the CAD controller 10 determines the bResult as "TRUE", and if there is no overlap between the product and the cut geometry (part$_{Cutter}$), no cutting has been done and therefore the CAD controller 10 determines the bResult as "FALSE".

The CAD controller 10 may determine the number of times the product is cut. For example, even if the product is cut, it cannot be said that cutting has been done unless the product is cut into two or more parts. Thus, if the number of times the product is cut is 1 and the product is cut into two or more parts, the CAD controller 10 determines that cutting has been done.

The CAD controller 10 estimates the amount (mass) of secondary waste generated from the cutting process (S30). For example, the CAD controller 10 calculates the volume of the geometry of an intersection between the product and the cut geometry (e.g., cutter) by performing an intersect operation on the product and the cut geometry, and estimates the amount of secondary waste generation by multiplying the calculated volume and the density of the product. Here, if the product is made of wood, the secondary waste may be sawdust, and if the product is made of metal, the secondary waste may be metal pieces, etc. The secondary waste may be radioactively-contaminated material and therefore may be disposed of.

The input and output of a cutting process simulation according to the exemplary embodiment of the present invention refer to information on "partbody" which every CAD file commonly has. Thus, no error occurs even if the output is used again as the input, and this allows infinite repetitions of cutting. Also, since a topological geometry is used to save a cut geometry as a CAD file, the data capacity does not increase even if a cutting operation is repeated. Hence, there is no overload caused by an increase in data capacity even if the product (or part) is cut several hundreds of times or more.

In a general CAD file, information on past operations may be saved in a specification history, and geometry can be easily changed by modifying operational parameters. However, the data capacity of the specification history increases with increasing number of repetitions of operations. As such, if a large-scale structure several is cut hundreds of times or more, as in the process of decommissioning a nuclear facility, this will bring about instability due to an increase in data capacity. By contrast, the cutting process simulation method and system according to the present invention use a topological geometry with no specification history, and therefore the data capacity does not increase even if the product (or part) is repeatedly cut. Data, etc. corresponding to the topological geometry is saved in a storage part 30.

A cutting process simulation algorithm according to the exemplary embodiment of the present invention is described in pseudocode.

```
01: PartCutting(part_Product, Part_Cutter)
02: part_1 = CreateNewPart( );
03: product = GetParrentProduct(part_Product)
04: part_1 = Append(product)
05: body_Product,partbody = GetBody(part_Product, partbody)
06: body_part1,Product = Copy(body_Product,partbody, Part1)
07: body_Cutter,partbody = GetBody(part_Cutter, partbody)
08: body_part1,Cutter = Copy(body_Cutter,partbody, part_1)
09: body_part1,Intersect = Intersect(body_part1,Product, body_part1,Cutter)
10: fVol_Intersect = GetVolume(body_part1,Intersect)
11: fWeight_2nd waste = fVol_Intersect * GetDensity(body_part1,Product)
12: if fVol_Intersect == 0,
13:    nPart = 1
14:    bResult = FALSE
15:    Delete(part_1)
16:    return bResult, nPart, fWeight_2nd waste
17: endif
```

-continued

```
18: body_part1,Remove = Remove(body_part1,Product, body_part1,Cutter)
19: topSolid_body,Remove = GetResults(body_part1,Remove)
20: topVolume = GetAllCells(topSolid_body,Remove, Volume)
21: nVol = SizeOf(topVolume)
22: topFace = GetAllCells (topVolume_1, Face)
23: nFac = SizeOf(topFace)
24: for i = 1; i <= nFac; i++,
25:    specObj = Featurize(topFace_i)
26:    specSet = Append(specObj)
27: endfor
28: specObj = CreateAssemble(specSet)
29: body_part1,CloseSurface = CreateCloseSurface(specObj)
30: topSolid_body,CloseSurface = GetResults(body_part1,CloseSurface)
31: body_part1,partbody = GetBody(part_1, partbody)
32: body_part1,partbody = Copy(topSolid_body,CloseSurface, part_1)
33: for i = 1; i < nVol; i++,
34:    part_{i+1} = CreateNewPart( );
35:    part_{i+1} = Append(product)
36:    topFace = GetAllCells (topVolume_{i+1}, Face)
37:    nFac = SizeOf(topFace)
38:    for j = 1; j <= nFac; j++,
39:       specObj = Featurize(topFace_j)
40:       specSet = Append(specObj)
41:    endfor
42:    specObj = CreateAssemble(specSet)
43:    body_part1,CloseSurface = CreateCloseSurface(specObj)
44:    topSolid_body,Closesurface = GetResults(body_part1,CloseSurface)
45:    body_{parti+1,partbody} = GetBody(part_{i+1}, partbody)
46:    body_{parti+1,partbody} = Copy(topSolid_body,CloseSurface, part_{i+1})
47: endfor
48: Delete(body_part1,Product)
49: Delete(body_part1,Cutter)
50: Delete(body_part1,Intersect)
51: Delete(body_part1,Remove)
52: bResult = TRUE
53: nPart = nVol
54: return bResult, nPart, fWeight_2nd waste
``` part$_{Product}$: A part corresponding to a product part$_{Cutter}$: A part corresponding to a cut geometry body$_{Product,partbody}$: A body corresponding to a partbody that defines a product which is subordinate to part$_{product}$ body$_{part1,Product}$: A body corresponding to a product which is subordinate to part$_1$ body$_{Cutter,partbody}$: A body corresponding to a partbody that defines a cut geometry (cutter) which is subordinate to part$_{Cutter}$ body$_{part1,Cutter}$: A body corresponding to a cut geometry (cutter) which is subordinate to part$_1$ body$_{part1,Intersect}$: A body corresponding to a result of Intersect operation which is subordinate to part$_1$ body$_{part1,Remove}$: A body corresponding to a result of Remove operation which is subordinate to part$_1$ topSolid$_{body,Remove}$: A topological solid into which the final results of body$_{part1,Remove}$ are transformed Pseudocode Analysis 02-08: Create a new part$_1$, place it under the existing product, and then copy Product and Cutter to the new file since an operation object has to be placed in a file so as to perform a cutting operation 09-11: Calculate the volume of an intersection by performing an Intersect operation on Product and Cutter and estimate the amount (fWeight$_{2nd\ waste}$) of secondary waste generation 12-17: If the volume of the intersection obtained by the Intersect operation is 0, this means that no cutting has been done. So, set nPart to 1, set bResult to FALSE, delete the part$_1$ (cut-out), and then terminate the algorithm 18-21: Implement cutting by performing a Remove operation and calculate the number of volumes created by cutting by calculating nVol 22-32: Collect the faces of the first volume created by Remove operation to create a topSolid and copy it to the partbody of the $part_1$ (cut-out)

33-47: If nVol is equal to or greater than 2, repeat the operation of transforming $topVolume_{i+1}$ into a topSolid and copying it to the partbody of a $part_{i+1}$ (nVol-1) times 48-54: Delete all the bodies from the part1 (cut-out), except the partbody, set bResult to TRUE and set nPart to nVol, and terminate the algorithm As explained above, the cutting process simulation method and system according to the exemplary embodiment of the present invention create a cut-out by defining input parameters with respect to a partbody, which is created for every part. Thus, no error occurs when a cut part is cut over again, and this allows infinite repetitions of cutting.

In the cutting process simulation method and system according to the exemplary embodiment of the present invention, a cut-out is saved in the form of "topSolid", rather than in the form of "specObj", and therefore operations such as "Remove", "Intersect", etc. by a CAD kernel can be performed when a cut-out is cut over again. At the same time, this method and system can be run stably even if the cut-out is cut repeatedly several hundreds of times or more, because there is no increase in the capacity of the cut-out.

The cutting process simulation method and system according to the exemplary embodiment of the present invention can represent all possible cases that may occur in a cutting process, by implementing cutting when simulating the cutting process. For example, this method and system may represent cases where a cutting tool does not make contact with a product since a cutting trajectory is erroneously defined, where the product is machined but cannot be cut since it is not divided, where the product is machined and cut since it is divided into two, and where the product is cut into multiple pieces since it is divided into three or more by performing the cutting process just once.

The cutting process simulation method and system according to the exemplary embodiment of the present invention can estimate the amount of secondary waste generated from a cutting process.

The cutting process simulation method and system according to the exemplary embodiment of the present invention can be used to develop software which is capable of simulating the entire decommissioning process in conjunction with the existing commercially-available software since they use a CAD kernel.

The cutting process simulation method and system according to the exemplary embodiment of the present invention can save the cost and time required for decommissioning and ensure safety by efficiently optimizing nuclear facility decommissioning The cutting process simulation method and system according to the exemplary embodiment of the present invention can represent a cut geometry created in a cutting process and estimate the amount of secondary waste generated from the cutting process.

The cutting process simulation method and system according to the exemplary embodiment of the present invention can reduce the data capacity of cut objects even if the cut objects are cut over and over again repeatedly in the cutting process.

The invention claimed is:

1. A cutting process simulation system comprising:
a display that displays a product; and
a controller that cuts the product corresponding to a facility in a nuclear plant by using a CAD (computer-aided design) kernel and API (application programming interface) functions and that represents a cut geometry on the display, and
wherein the controller is configured to:
create the cut geometry for cutting the product into a solid model by using cutting tools and a cutting trajectory;
represent the cut geometry with a thickness and depth by performing a remove operation on the product according to the cut geometry;
save the cut geometry as a CAD file by using a topological geometry with no specification history; and
estimate an amount of secondary waste generated from the process of cutting the product in a unit of mass,
wherein the controller calculates volume of geometry of an intersection between the product and the cut geometry by performing an intersect operation on the product and the cut geometry, and estimates the amount of secondary waste generated by multiplying the calculated volume and density of the product; and
by setting a type of secondary waste differently according to one or more components included in the cut geometry;
an amount of sawdust is estimated as the amount of secondary waste when the cut geometry comprises wood; and
an amount of metal pieces is estimated as the amount of secondary waste when the cut geometry comprises metal.

2. The cutting process simulation system of claim 1, wherein, if there is an overlap between the product and the cut geometry, the controller determines that cutting has been done, and if there is no overlap between the product and the cut geometry, the controller determines that no cutting has been done.

3. The cutting process simulation system of claim 1, wherein the controller cuts the product repeatedly.

4. A cutting process simulation method comprising:
displaying a product on a display;
cutting the product corresponding to a facility in a nuclear plant by using a CAD (computer-aided design) kernel and API (application programming interface) functions; and
representing a cut geometry on the display,
wherein the cutting process simulation method further comprises:
creating the cut geometry for cutting the product into a solid model by using cutting tools and a cutting trajectory;
representing the cut geometry with a thickness and depth by performing a remove operation on the product according to the cut geometry;
saving the cut geometry as a CAD file by using a topological geometry with no specification history; and
estimating an amount of secondary waste generated from the process of cutting the product in a unit of mass,
wherein calculating volume of geometry of an intersection between the product and the cut geometry by performing an intersect operation on the product and the cut geometry, and estimating the amount of secondary waste generated by multiplying the calculated volume and density of the product; and
by setting a type of secondary waste differently according to one or more components included in the cut geometry;
an amount of sawdust is estimated as the amount of secondary waste when the cut geometry comprises wood; and an amount of metal pieces is estimated as the amount of secondary waste when the cut geometry comprises metal.

5. The cutting process simulation method of claim 4, further comprising:
   if there is an overlap between the product and the cut geometry, determining that cutting has been done; and
   if there is no overlap between the product and the cut geometry, determining that no cutting has been done.

6. The cutting process simulation system of claim 1, wherein the controller represents cases where the product is cut, where the product is cut but cannot be cut, where the product is cut into two parts, and where the product is cut into three or more parts.

\* \* \* \* \*